US012696790B2

(12) United States Patent
Huang et al.

(10) Patent No.: US 12,696,790 B2
(45) Date of Patent: Jul. 28, 2026

(54) SEMICONDUCTOR PACKAGE

(71) Applicant: Taiwan Semiconductor Manufacturing Company, Ltd., Hsinchu (TW)

(72) Inventors: Kuan-Yu Huang, Taipei (TW); Sung-Hui Huang, Yilan County (TW); Shang-Yun Hou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/314,071

(22) Filed: May 7, 2021

(65) Prior Publication Data

US 2022/0359323 A1 Nov. 10, 2022

(51) Int. Cl.
*H10W 74/10* (2026.01)
*H10W 72/20* (2026.01)

(52) U.S. Cl.
CPC ........... *H10W 74/10* (2026.01); *H10W 72/20* (2026.01)

(58) Field of Classification Search
CPC ................................ H01L 23/31; H01L 24/14
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |

(Continued)

FOREIGN PATENT DOCUMENTS

| | | | |
|---|---|---|---|
| JP | 2000031631 | 1/2000 | |
| JP | 2002353272 A | * 12/2002 | ............. H01L 24/11 |

(Continued)

OTHER PUBLICATIONS

"Office Action of Taiwan Counterpart Application", issued on Apr. 11, 2022, p. 1-p. 9.

(Continued)

*Primary Examiner* — Trang Q Tran
(74) *Attorney, Agent, or Firm* — JCIPRNET

(57) ABSTRACT

A semiconductor package includes a package substrate, an encapsulated semiconductor device, and a plurality of conductive bumps. The package substrate includes a device mounting region, a plurality of substrate pads and a solder resist layer. The encapsulated semiconductor device is disposed over the device mounting region and includes a plurality of device pads. The conductive bumps are connected between the plurality of substrate pads and the plurality of device pads through the solder resist layer and includes a first conductive bump on a periphery of the device mounting region. A first contact area of the first conductive bump for contacting respective one of the substrate pads is substantially greater than a second contact area of the first conductive bump for contacting respective one of the device pads.

23 Claims, 8 Drawing Sheets

(56) References Cited

U.S. PATENT DOCUMENTS

| | | | |
|---|---|---|---|
| 9,735,131 B2 | 8/2017 | Su et al. | |
| 10,672,719 B2 * | 6/2020 | Hur | H01L 23/3736 |
| 2007/0023920 A1 * | 2/2007 | Jao | H01L 23/367 |
| | | | 257/E23.102 |
| 2012/0299183 A1 | 11/2012 | Fujisawa | |
| 2013/0180772 A1 * | 7/2013 | Inoue | H05K 3/4007 |
| | | | 228/256 |
| 2013/0320569 A1 | 12/2013 | Aoki | |
| 2014/0231993 A1 * | 8/2014 | Kao | H01L 25/105 |
| | | | 257/738 |
| 2014/0376202 A1 | 12/2014 | Shibutani | |
| 2015/0228571 A1 * | 8/2015 | Shiraki | H01L 24/97 |
| | | | 257/701 |
| 2015/0371970 A1 * | 12/2015 | Sakurada | H01L 23/49838 |
| | | | 257/737 |
| 2018/0076184 A1 | 3/2018 | Chen et al. | |
| 2019/0109082 A1 * | 4/2019 | Mitsukura | H01L 23/12 |
| 2019/0252306 A1 * | 8/2019 | Park | H01L 23/3128 |
| 2019/0348303 A1 | 11/2019 | Kulkarni et al. | |
| 2020/0020603 A1 * | 1/2020 | Tsao | H01L 23/49816 |
| 2021/0407962 A1 * | 12/2021 | Kim | H01L 24/16 |
| 2022/0013463 A1 * | 1/2022 | Wu | H01L 25/0657 |
| 2022/0059440 A1 * | 2/2022 | Kang | H01L 23/3171 |
| 2022/0078914 A1 * | 3/2022 | Foo | H01L 23/49816 |

FOREIGN PATENT DOCUMENTS

| | | |
|---|---|---|
| JP | 2007067129 | 3/2007 |
| JP | 2007189084 | 7/2007 |
| TW | 201240042 | 10/2012 |

OTHER PUBLICATIONS

"Office Action of China Counterpart Application", issued on Jan. 27, 2026, p. 1-p. 10.

* cited by examiner 144
134
1222
120
110
112

1221"(122")
132b
112
132a
132a
112
120
R1
100a

SEMICONDUCTOR PACKAGE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
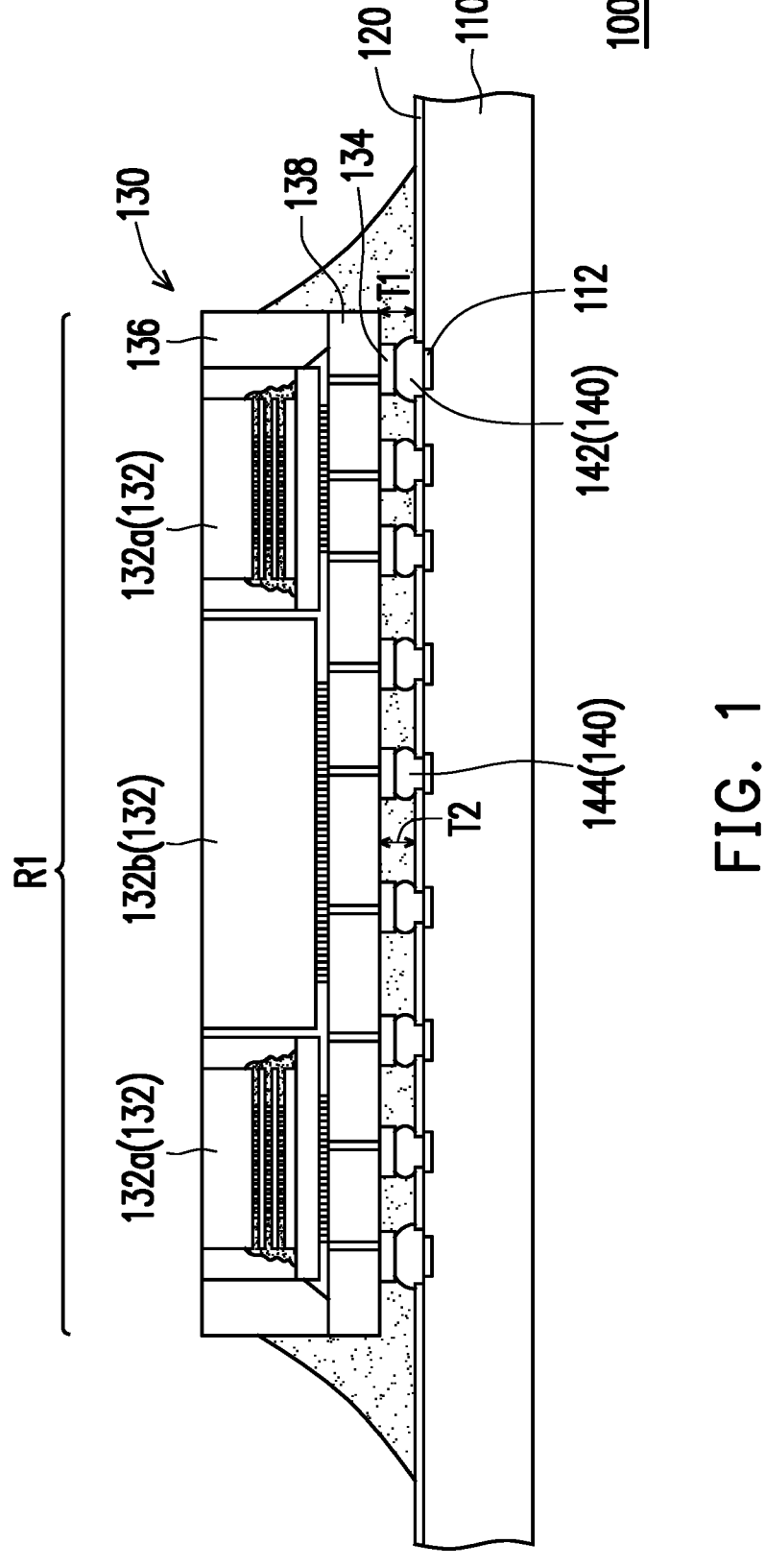
FIG. 1 illustrates a schematic cross sectional view of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of forming the same are provided in accordance with various embodiments. Embodiments will be described with respect to embodiments in a specific context, for example, a die-interposer-substrate stacked package using wafer-level multi-chip packaging process. Other embodiments may also be applied, however, to other packages, such as a die-die-substrate stacked package, and other processing. Like reference numbers and characters in the figures below refer to like components. Although method embodiments may be discussed as being performed in a particular order, other method embodiments may be performed in any logical order. In general terms, embodiments of the present disclosure may provide for an improved approach to reduce poor bump shape (e.g. solder necking) during a bonding process, such as, for example, a C4 (controlled collapse chip connection) bump process. As such, bonding strength of the semiconductor packages can be improved while increasing process yield.

Figure 2:
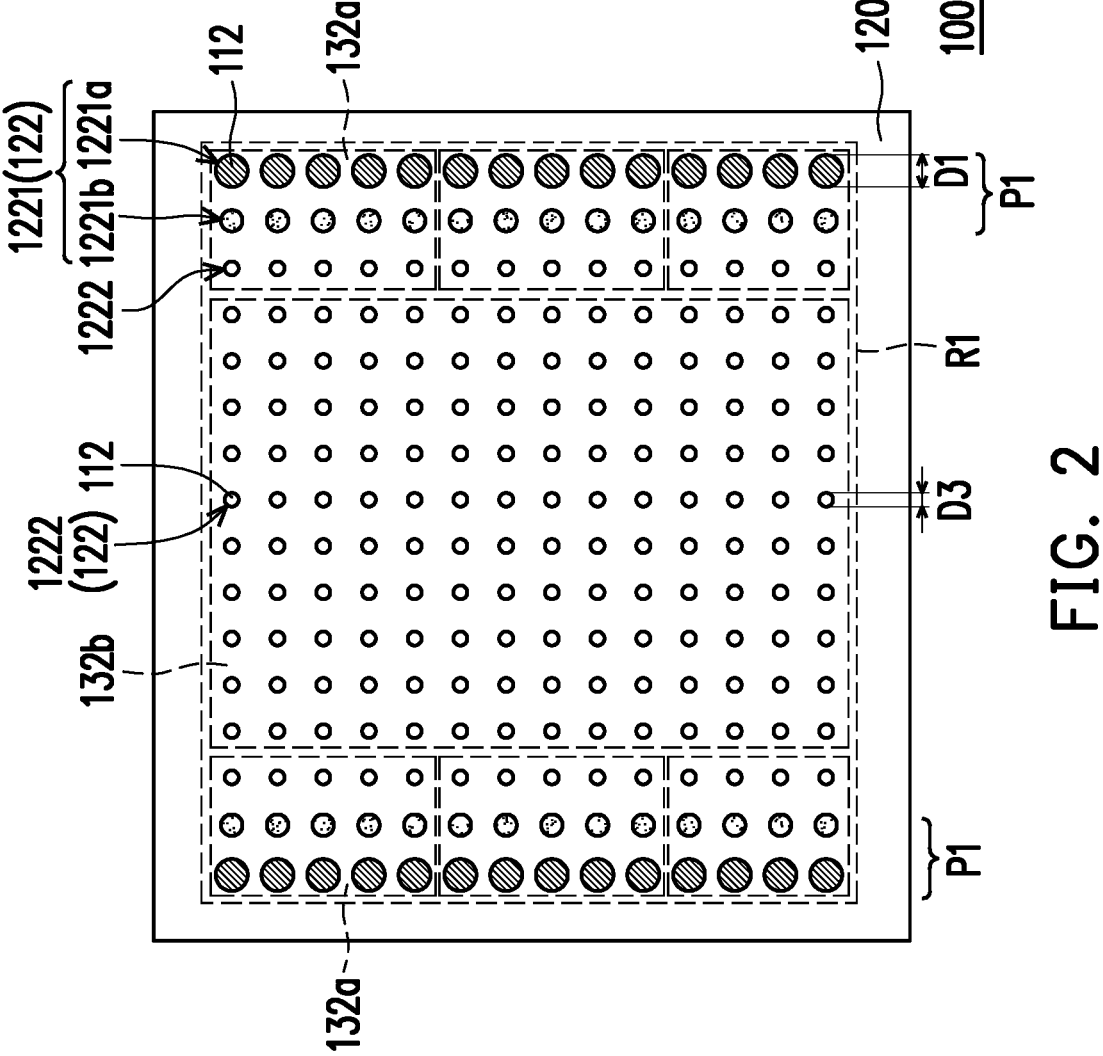
FIG. 2 illustrates a schematic top view of a semiconductor package according to some embodiments of the present disclosure.

FIG. 1 illustrates a schematic cross sectional view of a semiconductor package according to some embodiments of the present disclosure. FIG. 2 illustrates a schematic top view of a semiconductor package according to some embodiments of the present disclosure. In the present embodiment, the semiconductor package 100 may be formed using a wafer-level multi-chip packaging process that incorporates multiple chips side-by-side on an interposer and is completed through bonding to a package substrate, but the disclosure is not limited thereto. Referring to FIG. 1 and FIG. 2, in some embodiments, the semiconductor package 100 includes a package substrate 110, an encapsulated semiconductor device 130, and a plurality of conductive bumps 140. The package substrate 110 includes a device mounting region R1, a plurality of substrate pads 112 arranged within the device mounting region R1 and a solder resist layer 120 over the substrate pads 112. In some embodiments, the substrate pads 112 may be arranged on the package substrate 110 in an array manner. A size (e.g., a diameter) of each of the substrate pads 112 may be the same. In other embodiments, the sizes of the substrate pads 112 may be different from one another according to designs of device pads 134 of the encapsulated semiconductor device 130 to be mounted thereon. The disclosure is not limited thereto.

In some embodiments, the package substrate 110 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 110 may be a silicon on insulator (SOI) substrate. Generally, an SOI substrate includes a layer of a semiconductor material such as epitaxial silicon, germanium, silicon germanium, silicon-germanium-on-insulator (SGOI), or combinations thereof. The package substrate 110 is, in one alternative embodiment, based on an insulating core such as a fiberglass reinforced resin core. One example core material is fiberglass resin such as FR4. Alternatives for the core material include BT resin, or alternatively, other PC board materials or films. Build up films such as ABF or other laminates may be used for the package substrate 110.

In some embodiments, the package substrate 110 may include active and passive devices (not shown in FIG. 1). As one of ordinary skill in the art will recognize, a wide variety of devices such as transistors, capacitors, resistors, combinations of these, and the like may be used to generate the structural and functional requirements of the design for the package substrate 110. The devices may be formed using any suitable methods. The package substrate 110 includes a plurality of substrate pads 112 on a side of the package substrate 110. In some embodiments, the substrate pad 112 may include a thin seed layer (not shown) made of copper, titanium, nickel, gold, the like, or a combination thereof. The conductive material of the substrate pad 112 may be deposited over the thin seed layer. The conductive material may be formed by an electro-chemical plating process, chemical vapor deposition (CVD) process, atomic layer deposition (ALD) process, physical vapor deposition (PVD) process, the like, or any combination thereof. In an embodiment, the conductive material of the substrate pad 112 is copper, tungsten, aluminum, silver, gold, the like, or a combination thereof.

In an embodiment, the substrate pad 112 may be an under bump metallization (UBM) that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM. Any suitable materials or layers of material that may be used for the UBM are fully intended to be included within the scope of the current disclosure. The package substrate 110 may further include conductive traces and/or cores (not shown), which are electrically connected to the substrate pads 112. In some embodiments, the package substrate 220 may have a top-view area greater than the top-view area of the encapsulated semiconductor device 130 to be mounted thereon.

FIG. 2 illustrates a schematic top view of a semiconductor package according to some embodiments of the present disclosure. It is noted that the encapsulated semiconductor device 130 is depicted in a perspective manner in FIG. 2 for better illustrating the underlying structures such as the solder resist layer 120 and the package substrate 110, etc. Referring to FIG. 1 and FIG. 2, in accordance with some embodiments of the disclosure, the solder resist layer 120 is disposed on the package substrate 110 and includes a plurality of solder resist opening patterns 122 over and corresponding to the substrate pads 112. Namely, the solder resist opening patterns 122 are located right above the substrate pads 112 for exposing the substrate pads 112 underneath. It is noted that, throughout the description, "opening pattern(s)" indicates opening(s) that may or may not be filled with other material, such as conductive material, insulating material, underfill, etc. That is, the opening pattern(s) herein may be seen as an opening space or may be filled up in the final structure (product). The disclosure is not limited thereto.

In some embodiments, the encapsulated semiconductor device 130 is disposed over the device mounting region R1. To be more specific, the encapsulated semiconductor device 130 is mounted on the device mounting region R1 of the package substrate 110 through the conductive bumps 140. In detail, the encapsulated semiconductor device 130 includes a plurality of device pads 134 corresponding to the solder resist opening patterns 122. In some embodiments, the encapsulated semiconductor device 130 may further include an encapsulating material 136, at least one semiconductor device 132 (multiple semiconductor devices 132a, 132b are illustrated) encapsulated by the encapsulating material 136 and an interconnect structure 138 disposed over the semiconductor device 132 and the encapsulating material 136. In the present embodiment, the device pads 134 are located on the interconnect structure 138, which may be an interposer (interposing wafer). In the present embodiment, the interposer 138 is disposed over the package substrate 110 and includes the device pads 134 that face the package substrate 110. In other embodiments, the interconnect structure 138 may be a redistribution layer (RDL) including one or more dielectric layer(s) and respective metallization pattern(s) in the dielectric layer(s). The conductive bumps 140 are disposed in the solder resist opening patterns 122 respectively for bonding the substrate pads 112 and the device pads 134. The resulting package is referred to as the semiconductor package 100 shown in FIG. 1.

Referring to FIG. 1, in the bonding process, due to the mismatch between the materials in the encapsulated semiconductor device 130, the encapsulated semiconductor device 130 suffers from warpage, especially for the larger packages made by wafer-level multi-chip packaging process. For example, the encapsulating material 136 may have a coefficient of thermal expansion (CTE) significantly greater than the CTE of the interconnect structure 138. Accordingly, when heated, the upper portion of the encapsulated semiconductor device 130 expands more than the lower portion of the encapsulated semiconductor device 130. As a result, the encapsulated semiconductor device 130 suffers from warpage, and a peripheral portion of the encapsulated semiconductor device 130 are lower than the center portion (i.e., T2>T1). As a result of the warpage, the peripheral portion of encapsulated semiconductor device 130 may be too close to package substrate 110, and cause the (first) conductive bumps 142 (which are close to the peripheral portion of encapsulated semiconductor device 130) to be crushed. This in turn results in poor joint shape of the conductive bumps 142, and may cause bridging or open of the conductive bumps 142 at the peripheral portion of encapsulated semiconductor device 130.

Figures 3, 4:
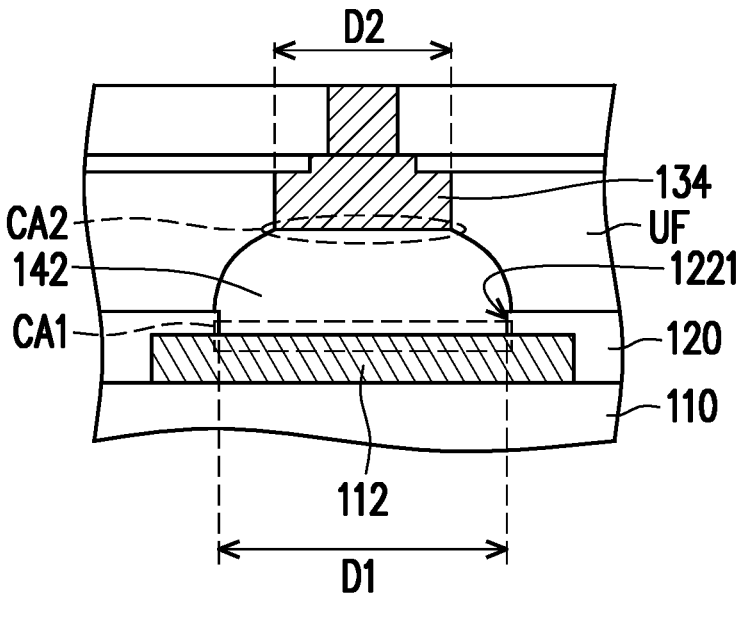
FIG. 3 illustrates a partial cross sectional view of a semiconductor package according to some embodiments of the present disclosure.
FIG. 4 illustrates a partial cross sectional view of a semiconductor package according to some embodiments of the present disclosure.

FIG. 3 illustrates a partial cross sectional view of a semiconductor package according to some embodiments of the present disclosure. Referring to FIG. 2 and FIG. 3, accordingly, the size (e.g., diameter) of the (first) solder resist opening pattern 1221 disposed on a periphery of the device mounting region R1 is increased to provide more stretching space for the conductive bump 140 with low standoff. Thereby, the contact area between the conductive bump 140 and the substrate pad 112 can be increased, while increasing process yield. For example, the solder resist opening patterns 122 includes at least one first solder resist opening pattern 1221 disposed on the periphery of the device mounting region R1, and the diameter D1 of the first solder resist opening pattern 1221 is substantially greater than the diameter D2 of respective one of the plurality of device pads 134. In the present embodiment, the first solder resist opening pattern 1221 partially covers respective one of the substrate pads 112, but the disclosure is not limited thereto.

With such configuration, the (first) conductive bumps 142 disposed in such solder resist opening pattern 1221 on the periphery of the device mounting region R1 may also have corresponding structural features. For example, the (first) conductive bump 142 disposed in the first solder resist opening pattern 1221, includes a lower surface and an upper surface opposite to each other. The lower surface contacts the respective one of the substrate pads 112 and the upper surface contacts the respective one of the device pads 134, and the diameter (e.g., diameter D1) of the lower surface is substantially greater than the diameter (e.g., diameter D2) of the upper surface. In other words, the lower portion of the conductive bump 142 is substantially greater (wider) than the upper portion of the conductive bump 142. In the present embodiment, the conductive bump 142 is in contact with a side wall of the first solder resist opening pattern 1221, but does not in contact with a side surface of the corresponding substrate pad 112. Namely, the shape of the conductive bump 142 is defined (confined) by the solder resist opening pattern 1221. In such embodiments, a first contact area CA1 of the conductive bump 142 for contacting respective one of the substrate pads 112 is substantially greater than a second contact area CA2 of the conductive bump 142 for contacting respective one of the device pads 134. Generally speaking, the bonding (soldering) strength depends on the overlapping area of the device pad and the solder resist opening pattern from a top view. The larger the overlapping area is, the greater bonding strength (quality) can be. Therefore, by increasing the size of the first solder resist opening pattern 1221, the bonding strength can be significantly improved.

Referring to FIG. 2, in some embodiments, the encapsulated semiconductor device 130 includes a plurality of first semiconductor devices 132a and a second semiconductor device 132b electrically connected to the device pads 134. The second semiconductor device 132b may be surrounded by the first semiconductor devices 132a. In the present embodiments, the first semiconductor devices 132a are disposed on two opposite sides of the second semiconductor device 132b. In one implementation, the first semiconductor devices 132a may be a plurality of memory dies such as high bandwidth memories (HBMs), and the second semiconductor device 132b may be a processor die such as a system on chip (SoC). However, the disclosure is not limited thereto. The first semiconductor devices 132a and the second semiconductor device 132b may be encapsulated by the encapsulating material 136 altogether, or encapsulated by encapsulating materials respectively.

In some embodiments, the solder resist opening patterns 122 may include a plurality of first solder resist opening patterns 1221. In other words, the quantity of the first solder resist opening patterns 1221 is plural. The first solder resist opening patterns 1221 may be arranged on two opposite sides of the periphery of the device mounting region R1 where the warpage of the encapsulated semiconductor device 130 is most severe. In some embodiments, the layout of the first solder resist opening patterns 1221 may be corresponding to the layout of the first semiconductor devices 132a. In the present embodiment, the first solder resist opening patterns 1221 are overlapped with a peripheral portion P1 of the first semiconductor devices 132a from a top view as it is shown in FIG. 2. In one of the implementations, the peripheral portion P1 may be about half of the footprint of the first semiconductor devices 132a, but the disclosure is not limited thereto.

In the present embodiment, the sizes of the first solder resist opening patterns 1221 may be different from one another. For example, the first solder resist opening patterns 1221 may further includes an outermost column of solder resist opening patterns 1221a on the device mounting region R1 and an inner column of solder resist opening patterns 1221b on the device mounting region R1 adjacent to the outermost column of the solder resist opening patterns 1221a. The diameter D1 of each of the solder resist opening patterns 1221a is substantially greater than a diameter of each of the solder resist opening patterns 1222b.

Figures 5, 6:
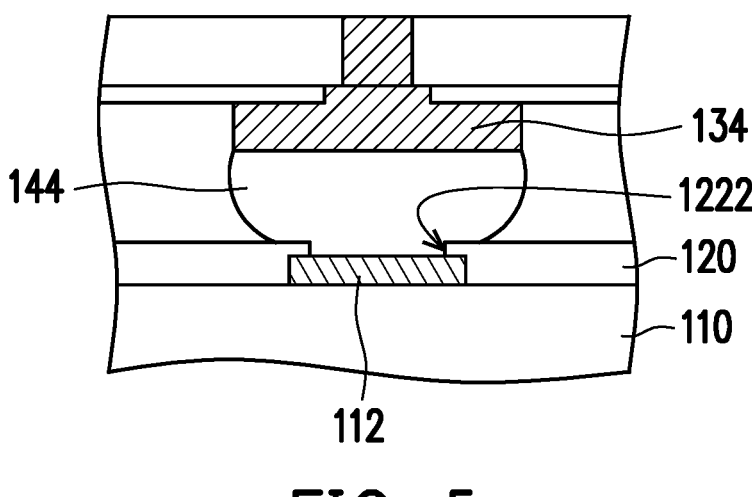
FIG. 5 illustrates a partial cross sectional view of a semiconductor package according to some embodiments of the present disclosure.
FIG. 6 illustrates a schematic top view of a semiconductor package according to some embodiments of the present disclosure.

FIG. 5 illustrates a partial cross sectional view of a semiconductor package according to some embodiments of the present disclosure. Referring to FIG. 2 and FIG. 5, in some embodiments, the solder resist opening patterns 122 may further include a plurality of second solder resist opening patterns 1222 surrounded by the first solder resist opening patterns 1221. In other words, the second solder resist opening patterns 1222 are disposed on a central portion of the device mounting region R1. It is noted that "center" and "periphery" herein may not be interpreted literally but rather be deemed as spatially relative terms, which are intended to encompass different orientations of the device in use or operation in addition to the orientation depicted in the figures. The diameter D1 of each of the first solder resist opening patterns 1221 (including solder resist opening patterns 1221a and 1221b) is substantially greater than a diameter D3 of each of the second solder resist opening patterns 1222. In the present embodiment, the first solder resist opening patterns 1221 are disposed at two opposite sides of the second solder resist opening patterns 1222. From a top view, the second solder resist opening patterns 1222 may be overlapped with the second semiconductor device 132b and the rest portion of the first semiconductor devices 132a, which are not overlapped with the first solder resist opening patterns 1221.

Herein, the second solder resist opening patterns 1222 may be seen as the "regular" solder resist opening patterns, and the sizes (diameters) thereof are substantially equal to or smaller than the sizes (diameters) of the device pads 134. The first solder resist opening patterns 1221 may be seen as the "enlarged" solder resist opening patterns, and the sizes (diameters) thereof are substantially greater than the sizes (diameters) of the device pads 134 for low standoff situation mentioned earlier. In some embodiments, a diameter D1 of one of the first solder resist opening patterns 1221 (e.g. solder resist opening patterns 1221a) is up to about 1.5 times greater than a diameter D3 of one of the second solder resist opening patterns 1222. However, the disclosure is not limited thereto. Accordingly, the conductive bumps 142, 144 are disposed in the first solder resist opening patterns 1221 and the second solder resist opening patterns 1222 for bonding the encapsulated semiconductor device 130 and the package substrate 110.

FIG. 4 illustrates a partial cross sectional view of a semiconductor package according to some embodiments of the present disclosure. It is noted that the semiconductor package shown in FIG. 4 contains many features same as or similar to the semiconductor package 100 disclosed earlier with FIG. 1 to FIG. 3. For purpose of clarity and simplicity, detail description of same or similar features may be omitted, and the same or similar reference numbers denote the same or like components. The main differences between the semiconductor package shown in FIG. 4 and the semiconductor package 100 disclosed earlier with FIG. 1 to FIG. 3 are described as follows.

In some embodiments, the diameter D1' of the first solder resist opening pattern 1221' is substantially greater than the diameter D2 of respective one of the substrate pads 112. In other words, the first solder resist opening pattern 1221' completely exposes the respective one of the substrate pads 112. With such configuration, during the reflow process, the (first) conductive bump 142 disposed in the first solder resist opening pattern 1221' may cover a side surface of the respective one of the substrate pads 112. Thereby, the solder contact area is further increased, so bonding strength between the encapsulated semiconductor device 130 and the package substrate 110 can be further improved. In the present embodiment, a first contact area CA1' of the conductive bump 142 for contacting respective one of the substrate pads 112 is substantially greater than a second contact area CA2 of the conductive bump 142 for contacting respective one of the device pads 134. In addition, the conductive bump 142 can be confined in the first solder resist opening pattern 1221', so the issues of bridging and/or opening of the conductive bump 142 due to low standoff on peripheral region can be avoided or at least significantly improved. In the present embodiment, the (first) conductive bump 142 is in contact with the side surface of the respective one of the substrate pads 112, but may not be in contact with a side wall of the first solder resist opening pattern 1221'. In some embodiments, an underfill UF may fill the space between the semiconductor device 130 and the package substrate 110, and the conductive bump 142 and the solder resist layer 120' may be spaced apart by the underfill UF.

Figure 7A:
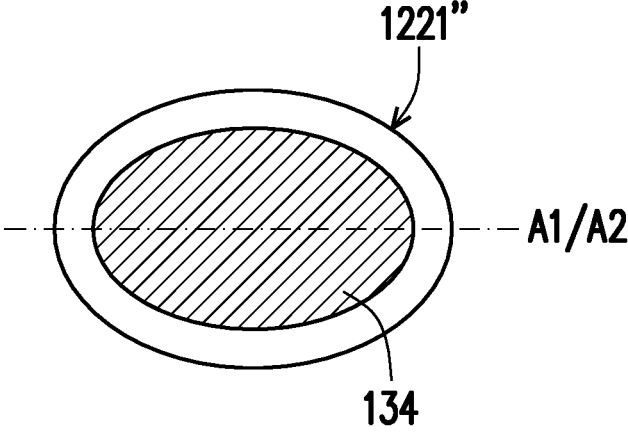
FIG. 7A illustrates a schematic view of a device pad and a solder resist opening pattern of a semiconductor package according to some embodiments of the present disclosure.
Figure 7B:
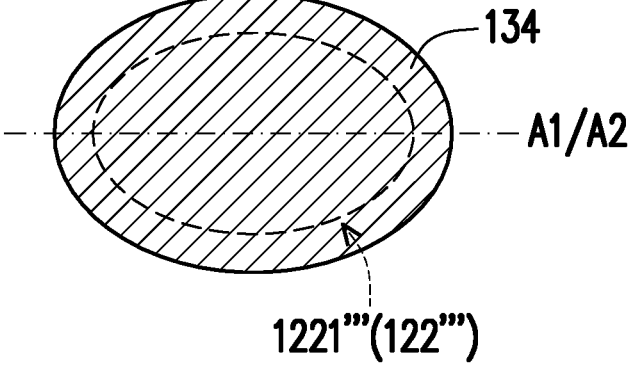
FIG. 7B illustrates a schematic view of a device pad and a solder resist opening pattern of a semiconductor package according to some embodiments of the present disclosure.

FIG. 6 illustrates a schematic top view of a semiconductor package according to some embodiments of the present disclosure. FIG. 7A illustrates a schematic view of a device pad and a solder resist opening pattern of a semiconductor package according to some embodiments of the present disclosure. FIG. 7B illustrates a schematic view of a device pad and a solder resist opening pattern of a semiconductor package according to some embodiments of the present disclosure. It is noted that the semiconductor package 100a shown in FIG. 6 to FIG. 7B contains many features same as or similar to the semiconductor package 100 disclosed earlier with FIG. 1 to FIG. 3. For purpose of clarity and simplicity, detail description of same or similar features may be omitted, and the same or similar reference numbers denote the same or like components. The main differences between the semiconductor package 100a shown in FIG. 6 to FIG. 7B and the semiconductor package 100 disclosed earlier with FIG. 1 to FIG. 3 are described as follows.

With now reference to FIG. 6 to FIG. 7B, in some embodiments, the device pads 134 are all in ellipse shapes and may be arranged in radial manner. As it is mentioned earlier, the bonding (soldering) strength depends on the overlapping area of the device pad and the solder resist opening pattern from a top view. The larger the overlapping area is, the greater bonding strength (quality) can be. Accordingly, in order to maximize the overlapping area of the device pad 134 and the solder resist opening pattern 122", one of the solder resist opening patterns 122" (e.g., first solder resist opening pattern 1221") on a periphery of the device mounting region R1 are also in ellipse shapes. In such embodiment, a major axis A1 of the (first) solder resist opening patterns 1221" may be substantially collinear with a major axis (A2) of the respective one of the device pads 134 from a top view. That is to say, in the present embodiment, the first solder resist opening pattern 1221" at the periphery of the device mounting region R1 is conformal with the corresponding device pad 134. To be more specific, a boundary of the first solder resist opening pattern 1221" may be substantially parallel to a boundary of the corresponding device pad 134 from a top view.

For the ease of the design, in the present embodiment, not only the solder resist opening pattern 1221" at the periphery of the device mounting region R1 is in ellipse shape, but all of the solder resist opening patterns 122" are in ellipse shapes and arranged in radial manner as the device pads 134 are. As such, a major axis A1 of each of the solder resist opening patterns 122" is substantially collinear with a major axis A2 of each of the plurality of device pads 134 from a top view. Accordingly, the conductive bumps (e.g., conductive bumps 140 shown in FIG. 1) may be disposed in the solder resist opening patterns 122" respectively for bonding the substrate pads 112 and the device pads 134. It is noted that, in the present embodiment, the previous layout of the solder resist opening patterns 122 may also be applied. That is, the size of the first solder resist opening pattern 1221", which is in ellipse shape, at the periphery of the device mounting region R1 may be substantially greater than the sizes of the rest of the solder resist opening pattern 122", and/or greater than the size of respective one of the device pads 134. In an alternative embodiment shown in FIG. 7B, with the design of ellipse-shaped opening patterns, the size of the solder resist opening pattern 1221'" may be substantially equal to the sizes of the rest of the solder resist opening patterns 122'". In addition, the size of the solder resist opening pattern 1221'" may be substantially equal to or smaller than the size of the device pad 134. Namely, since the design of ellipse-shaped solder resist opening patterns maximize the overlapping area of the device pad and the solder resist opening patterns, the solder resist opening patterns at the periphery may have the same size as the rest of the solder resist opening patterns.

FIG. 8 to FIG. 12 illustrate partial cross sectional views of intermediate stages in the manufacturing of a semiconductor package according to some embodiments of the present disclosure. FIG. 8 to FIG. 12 merely illustrates one of the possible ways to manufacturing semiconductor packages described above. As one of ordinary skill in the art will recognize, there are many other suitable processes that are suitable for the formation of the semiconductor packages in the disclosure. Like reference numbers and characters in the figures below refer to like components.

Figures 8, 9:
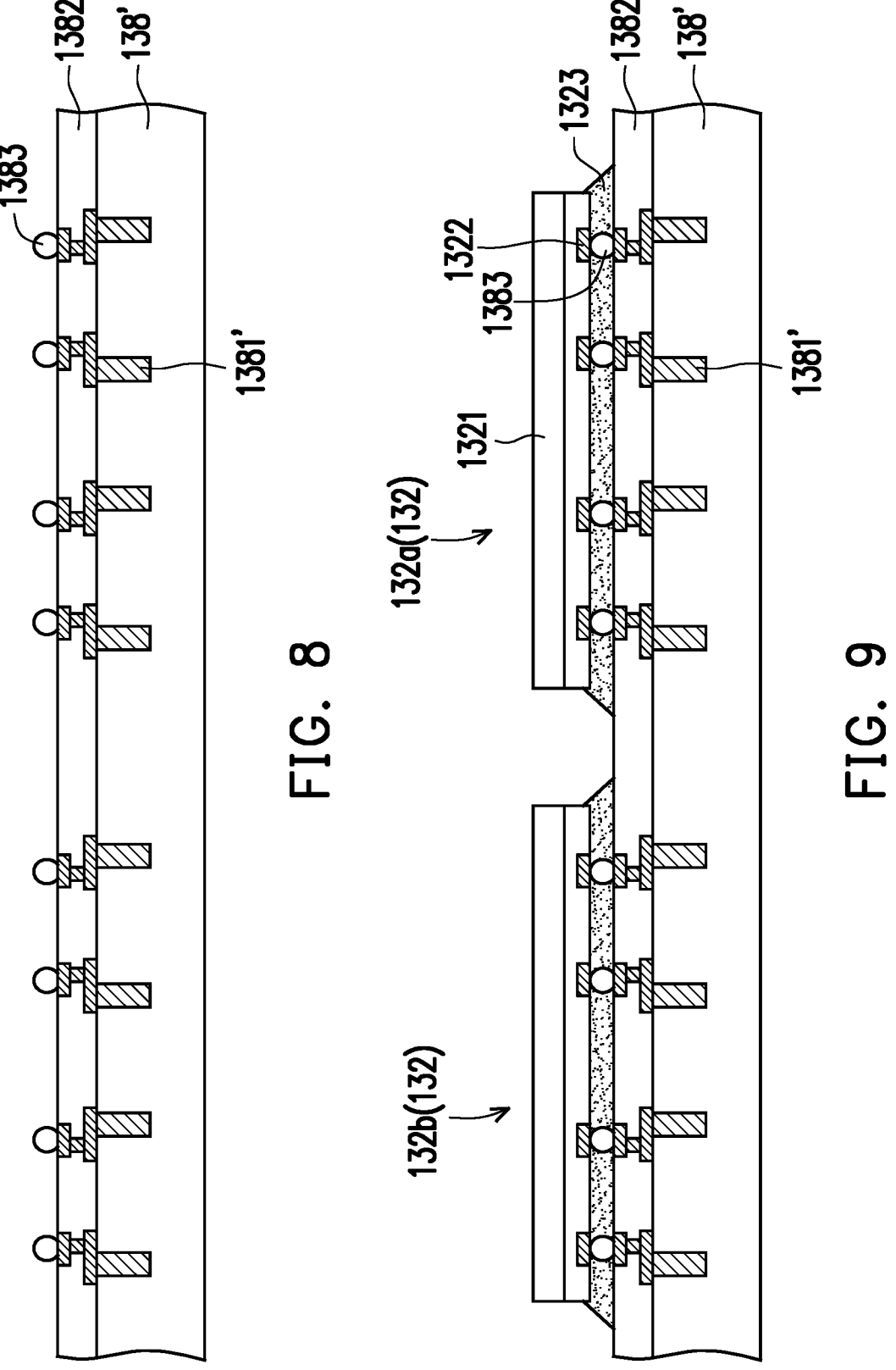
FIG. 8 to FIG. 12 illustrate partial cross sectional views of intermediate stages in the manufacturing of a semiconductor package according to some embodiments of the present disclosure.

With now reference to FIG. 8, in some embodiments, an interposer (interconnect structure) 138' as shown in FIG. 8 is provided. For example, the substrate of the interposer 138' may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the interposer 138' may be a SOI substrate. Generally, an SOI substrate includes a layer of a semiconductor material such as epitaxial silicon, germanium, silicon germanium, SOI, SGOI, or combinations thereof. The interposer 138' is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for interposer 138'. In other embodiments, the interposer 138' may be made of organic material and can be seen as a redistribution layer (RDL) including one or more dielectric layer(s) and respective metallization pattern(s) in the dielectric layer(s).

In some embodiments, the interposer 138' may include passive devices formed in and/or on, for example, a front side of the substrate. In other embodiments, the interposer 138' may include active and passive devices (not shown in FIG. 8) formed in and/or on, for example, the front side. As one of ordinary skill in the art will recognize, a wide variety of devices such as transistors, capacitors, resistors, combinations of these, and the like may be used to generate the structural and functional requirements of the design for the interposer 138'. The devices may be formed using any suitable methods.

In some embodiments, a plurality of through vias 1381' are formed to extend from the front side into the interposer 138'. The through vias 1381' are also sometimes referred to as through-substrate vias or through-silicon vias when the interposer is a silicon interposer. It is noted that the through vias 1381', at this stage, are still buried in the interposer 138' and does not extend through the interposer 138'. The through vias 1381' may be formed by forming recesses in the interposer 138' by, for example, etching, milling, laser techniques, the like, or a combination thereof. A thin barrier layer may be conformally deposited over the front side of the interposer 138' and in the openings, such as by CVD, ALD, PVD, thermal oxidation, the like, or a combination thereof. The barrier layer may comprise a nitride or an oxynitride, such as titanium nitride, titanium oxynitride, tantalum nitride, tantalum oxynitride, tungsten nitride, the like, or a combination thereof. A conductive material may be deposited over the thin barrier layer and in the openings. The conductive material may be formed by an electro-chemical plating process, CVD, ALD, PVD, the like, or a combination thereof. Examples of conductive materials are copper, tungsten, aluminum, silver, gold, the like, or a combination thereof. Excess conductive material and barrier layer is removed from the front side of the interposer 138' by, for example, a CMP. Thus, the through vias 1381' may include a conductive material and a thin barrier layer between the conductive material and the substrate of the interposer 138'.

In some embodiments, an redistribution structure 1382 is formed over the front side of the interposer 138', and is used to electrically connect the integrated circuit devices, if any, and/or the through vias 1381' together and/or to external devices. The redistribution structure 1382 may include one or more dielectric layer(s) and respective metallization pattern(s) in the dielectric layer(s). The metallization patterns may comprise vias and/or traces to interconnect any devices and/or through vias 1381' together and/or to an external device. The metallization patterns are sometimes referred to as redistribution lines. The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Electrical connectors 1383 are formed at the top surface of and electrically coupled to the redistribution structure 1382. The electrical connectors 1383 may be micro bumps, controlled collapse chip connection (C4) bumps, solder balls, metal pillars, electroless nickel-electroless palladium-immersion gold technique (ENEPIG) formed bumps, or the like. In the present embodiment, the electrical connectors 1383 are micro bumps. The electrical connectors 1383 may include a conductive material such as solder, copper, aluminum, gold, nickel, silver, palladium, tin, the like, or a combination thereof. In some embodiments, the electrical connectors 1383 may include metal pillars (such as a copper pillar) formed by a sputtering, printing, electro plating, electroless plating, CVD, or the like. The metal pillars may be solder free and have substantially vertical sidewalls. In some embodiments, a solder cap layer is formed on the top of the metal pillars by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

With now reference to FIG. 9, a plurality of semiconductor devices 132 are mounted to the front side of the interposer 138', for example, through flip-chip bonding. The electrical connectors 1383 electrically couple the circuits in the semiconductor devices 132*a*, 132*b* to the redistribution structure 1382 and the through vias 1381'. It is noted that two of the semiconductor devices are illustrated in FIG. 9 to FIG. 12. However, one of ordinary skill in the art will recognize that there may be more or less semiconductor devices 132 disposed over the interposer 138'.

For example, the semiconductor device 132*b* may be a logic die, such as a central processing unit (CPU), a graphics processing unit (GPU), the like, or a combination thereof. In some embodiments, the semiconductor device 132*a* may include a die stack (not shown) which may include memory die stack or a stack of logic dies and memory dies. In other embodiments, the semiconductor devices 132 may include an input/output (I/O) die, such as a wide I/O die.

The bonding between the semiconductor devices 132 and the redistribution structure 1382 may be a solder bonding or a direct metal-to-metal (such as a copper-to-copper or tin-to-tin) bonding. In an embodiment, the semiconductor devices 132 are bonded to the redistribution structure 1382 by a reflow process. During this reflow process, the electrical connectors 1383 are in contact with the bond pads 1322 and the redistribution structure 1382 to physically and electrically couple the semiconductor devices 132 to the redistribution structure 1382. An underfill material 1323 may be injected or otherwise formed in the space between the semiconductor devices 132 and the redistribution structure 1382 and surrounding the electrical connectors 1383. The underfill material 1323 may, for example, be a liquid epoxy, deformable gel, silicon rubber, or the like, that is dispensed between the structures, and then cured to harden.

This underfill material is used, among other things, to reduce damage to and to protect the electrical connectors 1383.

Figures 10, 11:
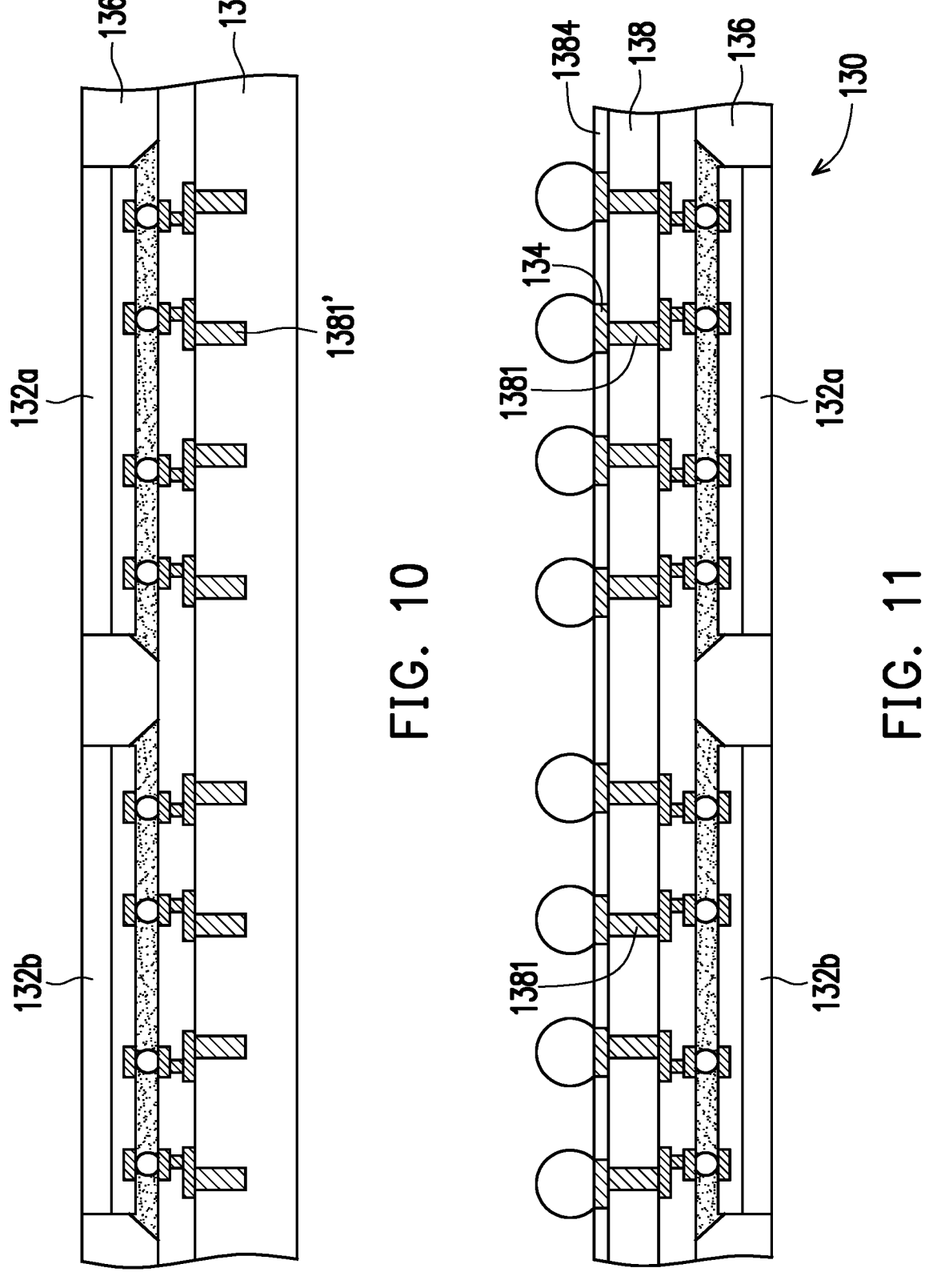

With now reference to FIG. 10, in some embodiments, after the semiconductor devices 132 are mounted on the interposer 138', the semiconductor devices 132a, 132b are encapsulated by an encapsulating material 136. The encapsulating material 136 fills the gaps between the semiconductor devices 132a, 132b, and may be in contact with the redistribution structure 1382. The encapsulating material 136 may be molded on the semiconductor devices 132a, 132b, for example, using compression molding. In some embodiments, the encapsulating material 136 is made of a molding compound, a polymer, an epoxy, silicon oxide filler material, the like, or a combination thereof. A curing step may be performed to cure the encapsulating material 136, wherein the curing may be a thermal curing, a Ultra-Violet (UV) curing, the like, or a combination thereof.

In some embodiments, after the encapsulation process, the top surface of encapsulating material 136 may be higher than the back surface of semiconductor devices 132a, 132b. Namely, the semiconductor devices 132a, 132b are buried in the encapsulating material 136. Then, a planarization process such as a chemical mechanical polish (CMP) process or a grinding process is performed to grind the encapsulating material 136 until the back surface of the semiconductor devices 132a, 132b are exposed. Other techniques including etching, laser ablation, polishing, and the like could be employed. The resulting structure is shown in FIG. 10. Due to the planarization, the back surfaces of semiconductor devices 132a, 132b may be substantially level (coplanar) with the top surface of encapsulating material 136. In an embodiment, the planarization process includes a grinding process, although other techniques including etching, laser ablation, polishing, and the like could be employed. The planarization process is used to planarize the encapsulating material 136 to provide a substantially planar top surface of the encapsulating material 136.

Referring to FIG. 11, in some embodiments, the resultant structure shown in FIG. 10 is then flipped over and the encapsulating material 136 may be adhered to a carrier substrate (not shown) to allow formation of the formation of back side of the interposer 138'. The carrier substrate may be any suitable substrate that provides (during intermediary operations of the fabrication process) mechanical support for the components and structures over the carrier substrate. In the formation of the back side of the interposer 138, a thinning process is performed on the back side of the interposer 138 until the through vias 1381 are exposed. In an embodiment, the thinning process is a grinding process, although other techniques including etching, laser ablation, polishing, and the like could be employed. At least one dielectric layer(s) 1384 may be formed on the back side of the interposer 138. The device pads 134 may be formed on the back side of the interposer 138 and in dielectric layer(s) 1384, using similar processes as discussed above.

In some embodiments, a plurality of conductive bumps 140 may also be formed on the back side of interposer 138 and are electrically coupled to the through vias 1381. In some embodiments, the conductive bumps 140 may include C4 bumps, solder balls, metal pillars, micro bumps, ENEPIG formed bumps, or the like. In the present embodiment, the conductive bumps 140 are C4 bumps. The conductive bumps 140 may include a conductive material such as solder, copper, aluminum, gold, nickel, silver, palladium, tin, the like, or a combination thereof. The conductive bumps 140 may be formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 12:
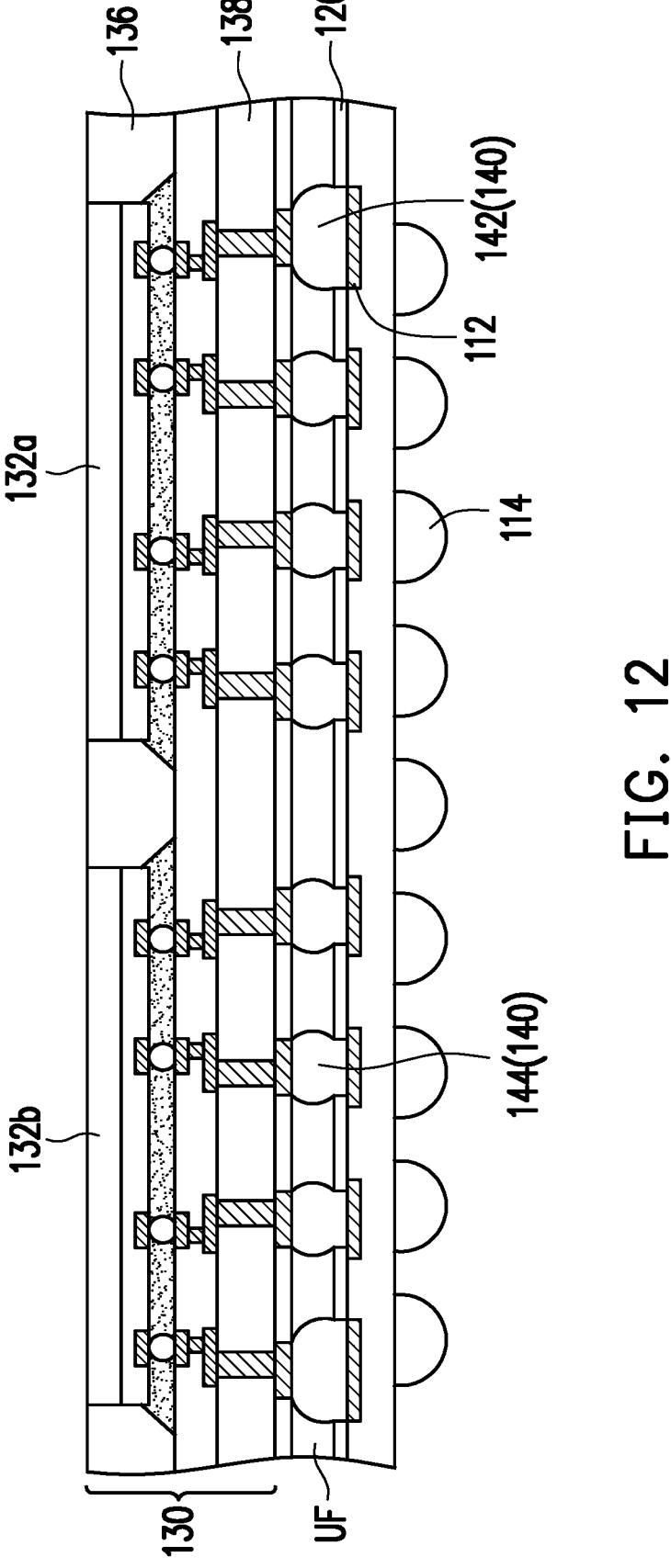

Referring to FIG. 11 and FIG. 12, the resultant structure shown in FIG. 11 can be seen as a composite wafer, which may then be sawed apart into a plurality of encapsulated semiconductor devices 130, wherein each of the encapsulated semiconductor devices 130 includes the interposer 138, the semiconductor devices 132, and encapsulating material 136, etc.

FIG. 12 illustrates the placement of the encapsulated semiconductor device 130 on the package substrate 110. The package substrate 110 includes the solder resist layer 120 with different layout (sizes) of the solder resist opening patterns as mentioned earlier. For example, the size (diameter) of the solder resist opening pattern 1121 at the periphery of the package is substantially greater than the size (diameter) of the respective one of the device pads 134. Accordingly, the conductive bumps 140 are aligned to, and are put against, the substrate pads 112 in the solder resist opening patterns 1121 of the package substrate 110.

Then, a reflow process is performed on the semiconductor package shown in FIG. 12, and the conductive bumps 140 are reflowed. The encapsulated semiconductor device 130 and the package substrate 110 are thus bonded to each other through flip-chip bonding. The resulting package is referred to as semiconductor package 100/100a. In the bonding process, the encapsulated semiconductor device 130 suffers from warpage, and the peripheral portion of the encapsulated semiconductor device 130 are lower than the center portion. As a result of the warpage, the peripheral portion of the encapsulated semiconductor device 130 may be too close to package substrate 110, which may cause the conductive bumps 142 at the peripheral portion to be crushed. With the special layout (sizes) of the solder resist opening patterns aforementioned, however, the size (diameter) of the solder resist opening pattern 1221 at the periphery is increased to provide more stretching space for the conductive bump 142 with low standoff. Thereby, the contact area between the conductive bump 142 and the substrate pad 112 can be increased, while increasing process yield.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a package substrate, an encapsulated semiconductor device, and a plurality of conductive bumps. The package substrate includes a device mounting region, a plurality of substrate pads and a solder resist layer. The encapsulated semiconductor device is disposed over the device mounting region and includes a plurality of device pads. The conductive bumps are connected between the plurality of substrate pads and the plurality of device pads through the solder resist layer and includes a first conductive bump on a periphery of the device mounting region, wherein a first contact area of the first conductive bump for contacting respective one of the substrate pads is substantially greater than a second contact area of the first conductive bump for contacting respective one of the device pads In accordance with some embodiments of the disclosure, a semiconductor package includes a package substrate, an interposer, a plurality of semiconductor devices, and a plurality of conductive bumps. The package substrate includes a device mounting region and a solder resist layer including a plurality of first solder resist opening patterns on a periphery of the device mounting region and a plurality of second solder resist opening patterns surrounded by the plurality of first solder resist opening patterns. A diameter of each of the first solder resist opening patterns is substantially greater than a diameter of each of the second solder resist opening patterns. The interposer is disposed over the package substrate and includes a plurality of device pads facing the package substrate. The plurality of semiconductor devices are disposed over the interposer and electrically connected to the plurality of device pads. The plurality of conductive bumps are disposed in the plurality of first solder resist opening patterns and the plurality of second solder resist opening patterns for bonding the encapsulated semiconductor device and the package substrate.

In accordance with some embodiments of the disclosure, a semiconductor package includes a package substrate, an encapsulated semiconductor device, and a plurality of conductive bumps. The package substrate includes a device mounting region, a plurality of substrate pads arranged within the device mounting region, and a solder resist layer comprising a plurality of solder resist opening patterns over and corresponding to the plurality of substrate pads. The encapsulated semiconductor device is disposed over the device mounting region and includes a plurality of device pads corresponding to the plurality of solder resist opening patterns. One of the solder resist opening patterns on a periphery of the device mounting region and respective one of the plurality of device pads are in ellipse shapes, and major axes of the one of the solder resist opening patterns and the respective one of the plurality of device pads are substantially collinear with each other from a top view. The plurality of conductive bumps are disposed in the plurality of solder resist opening patterns respectively for bonding the plurality of substrate pads and the plurality of device pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a package substrate comprising a plurality of substrate pads and a solder resist layer comprising an array of a plurality of second solder resist opening patterns and a plurality of first solder resist opening patterns surrounding the array of the plurality of second solder resist opening patterns, wherein diameters of the plurality of substrate pads disposed on an outermost surface of the package substrate are same, and a diameter of each of the plurality of first solder resist opening patterns is greater than a diameter of each of the plurality of second solder resist opening patterns;
an encapsulated semiconductor device over the package substrate and comprising a plurality of device pads, wherein a peripheral portion of the encapsulated semiconductor device is vertically closer to the package substrate than a center portion of the encapsulated semiconductor device is; and
a plurality of first conductive bumps disposed in the plurality of first solder resist opening patterns and a plurality of second conductive bumps disposed in the plurality of second solder resist opening patterns and disposed on the plurality of substrate pads and the plurality of device pads.

2. The semiconductor package as claimed in claim 1, wherein each of the plurality of first conductive bumps comprises a lower surface contacting respective one of the plurality of substrate pads and an upper surface contacting the respective one of the plurality of device pads, and a diameter of the lower surface is substantially greater than a diameter of the upper surface.

3. The semiconductor package as claimed in claim 1, wherein the plurality of first solder resist opening patterns are disposed on two opposite sides of the periphery of a device mounting region where the encapsulated semiconductor device is disposed.

4. The semiconductor package as claimed in claim 1, wherein one of the plurality of first solder resist opening patterns and respective one of the plurality of device pads are in ellipse shapes, and a major axis of one of the plurality of first solder resist opening patterns is substantially collinear with a major axis of the respective one of the plurality of device pads from a top view.

5. The semiconductor package as claimed in claim 1, wherein a first contact area of one of the plurality of first conductive bumps for contacting respective one of the plurality of substrate pads is substantially greater than a second contact area of the one of the plurality of first conductive bumps for contacting respective one of the plurality of device pads.

6. The semiconductor package as claimed in claim 1, wherein the encapsulated semiconductor device further comprises a semiconductor device encapsulated by an encapsulating material and an interposer where the semiconductor device and the encapsulating material mounted thereon, and the interposer disposed over the package substrate.

7. The semiconductor package as claimed in claim 1, wherein a diameter of one of the plurality of first solder resist opening patterns is substantially up to 1.5 times greater than a diameter of one of the plurality of second solder resist opening patterns.

8. The semiconductor package as claimed in claim 1, wherein the solder resist layer further comprises a plurality of third solder resist opening patterns fully on entire inner columns of the device mounting region adjacent to the outermost column of the plurality of first solder resist opening patterns, a diameter of each of the plurality of first solder resist opening patterns is substantially greater than a diameter of each of the plurality of third solder resist opening patterns.

9. The semiconductor package as claimed in claim 8, wherein the plurality of second solder resist opening patterns are surrounded by the plurality of third solder resist opening patterns, and a diameter of each of the plurality of third solder resist opening patterns is greater than a diameter of each of the plurality of second solder resist opening patterns.

10. The semiconductor package as claimed in claim 1, wherein a gap exists between each of the plurality of first conductive bumps and the respectively one of the plurality of first solder resist opening patterns.

11. The semiconductor package as claimed in claim 10, further comprising an underfill material filling a space between the package substrate and the encapsulated semiconductor device and fill the gap between each of the plurality of first conductive bumps and the respectively one of the plurality of first solder resist opening patterns.

12. A semiconductor package, comprising:
a package substrate comprising a plurality of substrate pads, and a solder resist layer comprising a plurality of first solder resist opening patterns and a plurality of second solder resist opening patterns surrounded by the plurality of first solder resist opening patterns, wherein diameters of the plurality of substrate pads disposed on an outermost surface of the package substrate are same, and a diameter of each of the plurality of first solder resist opening patterns is substantially greater than a diameter of each of the plurality of second solder resist opening patterns;
an interposer disposed over the package substrate and comprising a plurality of device pads disposed on an outermost surface of the interposer;
a plurality of first semiconductor devices and a second semiconductor device disposed over the interposer through a plurality of connectors, wherein the plurality of first semiconductor devices are disposed along a side of the second semiconductor device, and the plurality of first solder resist opening patterns disposed along an outermost side of each of the plurality of first semiconductor devices from a top view; and
a plurality of first conductive bumps disposed in the plurality of first solder resist opening patterns respectively and a plurality of second conductive bumps disposed in the plurality of second solder resist opening patterns respectively and disposed on the plurality of device pads of the interposer and the plurality of substrate pads of the package substrate respectively.

13. The semiconductor package as claimed in claim 12, wherein the diameter of the each of the plurality first solder resist opening patterns is substantially greater than a diameter of each of the plurality of device pads.

14. The semiconductor package as claimed in claim 12, wherein the plurality of first semiconductor devices are disposed along two opposite sides of the second semiconductor device.

15. The semiconductor package as claimed in claim 14, wherein the plurality of first solder resist opening patterns are overlapped with a peripheral portion of the plurality of first semiconductor devices from a top view, and the plurality of conductive bumps comprises a plurality of first conductive bumps disposed in the plurality of first solder resist opening patterns and a plurality of second conductive bumps disposed in the plurality of second solder resist opening patterns, and each of the plurality of first conductive bump is spaced apart from a sidewall of respective one of the plurality of first solder resist opening patterns.

16. The semiconductor package as claimed in claim 14, wherein the plurality of second solder resist opening patterns are overlapped with the second semiconductor device and a portion of the plurality of first semiconductor devices from a top view.

17. The semiconductor package as claimed in claim 12, wherein a diameter of one of the plurality first solder resist opening patterns is substantially up to 1.5 times greater than a diameter of one of the plurality second solder resist opening patterns.

18. The semiconductor package as claimed in claim 12, further comprising an encapsulating material over the interposer and at least laterally encapsulating the plurality of semiconductor devices.

19. The semiconductor package as claimed in claim 12, wherein the plurality of first solder resist opening patterns comprises an outermost column of the plurality of first solder resist opening patterns and an inner column of the plurality of first solder resist opening patterns adjacent to the outermost column of the plurality of first solder resist opening patterns, a diameter of each of the outermost column of the plurality of first solder resist opening patterns is substantially greater than a diameter of each of the inner column of the plurality of first solder resist opening patterns.

20. A semiconductor package, comprising:
a package substrate comprising, a plurality of substrate pads, and a solder resist layer comprising an array of a plurality of second solder resist opening patterns and a plurality of first solder resist opening patterns disposed along two opposite sides of the array of the plurality of second solder resist opening patterns wherein sizes of the plurality of substrate pads disposed on an outermost surface of the package substrate are same;
an encapsulated semiconductor device over the package substrate and comprising a plurality of semiconductor devices encapsulated by an encapsulating material and a plurality of device pads disposed on an outermost surface of the encapsulated semiconductor device, wherein a peripheral portion of the encapsulated semiconductor device is closer to the package substrate than a center portion of the encapsulated semiconductor device is, wherein one of the plurality of first solder resist opening patterns and a respective one of the plurality of device pads are in ellipse shapes, and a major axis of the one of the plurality of first solder resist opening patterns is substantially collinear with a major axis of the respective one of the plurality of device pads from a top view, and a minor axis of the respective one of the plurality of device pads is shorter than the major axis; and
a plurality of first conductive bumps disposed in the plurality of first solder resist opening patterns and a plurality of second conductive bumps disposed in the plurality of second solder resist opening patterns respectively and bonding the plurality of substrate pads and the plurality of device pads.

21. The semiconductor package as claimed in claim 20, wherein the encapsulated semiconductor device further comprises an interposer comprising the plurality of device pads and disposed over the device mounting region, a semiconductor device disposed over the interposer and encapsulated by an encapsulating material.

22. The semiconductor package as claimed in claim 20, wherein one of the plurality of first solder resist opening patterns and respective one of the plurality of device pads are in ellipse shapes, from a top view, and a long axis of the one of the plurality of first solder resist opening patterns is substantially longer than a short axis of the one of the plurality first solder resist opening patterns.

23. The semiconductor package as claimed in claim 22, wherein a size of each of the plurality of first solder resist opening pattern is substantially greater than a size of each of the plurality of second solder resist opening patterns.

* * * * *